(12) United States Patent
Marrs et al.

(10) Patent No.: US 10,512,194 B1
(45) Date of Patent: Dec. 17, 2019

(54) DEVICES, SYSTEMS, AND METHODS FOR THERMAL MANAGEMENT OF RACK-MOUNTED COMPUTING INFRASTRUCTURE DEVICES

(71) Applicant: VCE IP Holding Company LLC, Richardson, TX (US)

(72) Inventors: Samuel Maxwell Marrs, Bradley, IL (US); Alva Benjamin Eaton, Nottingham Park, IL (US); Michael Hladick, Bellingham, MA (US); Roger D. Segroves, Lockport, IL (US); Mark Donnell, Orland Park, IL (US)

(73) Assignee: VCE IP Holding Company, LLC, Richardson, TX (US)

( * ) Notice: Subject to any disclaimer, the term of this patent is extended or adjusted under 35 U.S.C. 154(b) by 0 days.

(21) Appl. No.: 15/618,808

(22) Filed: Jun. 9, 2017

(51) Int. Cl.
*H05K 7/20* (2006.01)

(52) U.S. Cl.
CPC ..... *H05K 7/20736* (2013.01); *H05K 7/20836* (2013.01)

(58) Field of Classification Search
CPC .................................................. H05K 7/20736
See application file for complete search history.

(56) References Cited

U.S. PATENT DOCUMENTS

| | | | | |
|---|---|---|---|---|
| 4,500,146 A * | 2/1985 | Peterson | ................ | A47B 45/00 108/102 |
| 5,505,244 A * | 4/1996 | Thumann | .................. | E06B 9/54 160/23.1 |
| 5,788,085 A * | 8/1998 | Pidcock | ................. | A47B 63/02 209/702 |
| 6,279,467 B1 * | 8/2001 | Tiemann | ................ | A21B 3/155 211/181.1 |
| 8,141,964 B1 * | 3/2012 | Yu | ........................ | H05K 7/1487 312/223.2 |
| 9,248,941 B1 * | 2/2016 | Legel | .................... | H05K 7/1488 |
| 9,559,499 B2 * | 1/2017 | Alvarez | ................... | H02B 1/01 |
| 9,629,285 B1 * | 4/2017 | Lachapelle | ........ | H05K 7/20145 |
| 9,888,606 B1 * | 2/2018 | Wendorf | ............ | H05K 7/20745 |
| 2003/0022552 A1 * | 1/2003 | Barker | ................. | G02B 6/4452 439/540.1 |
| 2008/0115956 A1 * | 5/2008 | Fransen | ................. | H05K 7/186 174/66 |
| 2010/0085726 A1 * | 4/2010 | Blomquist | ............... | H04Q 1/02 361/825 |
| 2010/0200523 A1 * | 8/2010 | Henderson | ........... | H05K 7/1489 211/26 |
| 2011/0006022 A1 * | 1/2011 | Caveney | .............. | H02G 3/0443 211/133.5 |

(Continued)

*Primary Examiner* — Lisa Lea-Edmonds
(74) *Attorney, Agent, or Firm* — Jenkins, Wilson, Taylor & Hunt P.A.

(57) ABSTRACT

Devices, systems, and methods for thermal management provide conditioned air from an inlet of an electronics cabinet to a rear-mounted interface device using an enclosure mounted in the electronics cabinet. The enclosure is laterally expandable in order to make installation easier and to enable installation of the enclosure between electronics cabinets of several mounting widths. The enclosure is installed to an internal surface of the mounting rails of the electronics cabinet so that the interface devices are mounted directly to the mounting rails, so the enclosure does not support the mass of the interface devices.

20 Claims, 11 Drawing Sheets

(56) References Cited

U.S. PATENT DOCUMENTS

| | | | | |
|---|---|---|---|---|
| 2013/0229766 A1* | 9/2013 | Williams | ................ | G06F 1/16 |
| | | | | 361/679.33 |
| 2014/0168891 A1* | 6/2014 | Mundt | .................. | G06F 1/188 |
| | | | | 361/679.58 |
| 2014/0175037 A1* | 6/2014 | Dart | ..................... | A47B 45/00 |
| | | | | 211/186 |
| 2014/0197121 A1* | 7/2014 | Knight | ................. | A47B 45/00 |
| | | | | 211/86.01 |
| 2015/0009616 A1* | 1/2015 | Adrian | ............... | H05K 7/1494 |
| | | | | 361/679.32 |
| 2015/0068999 A1* | 3/2015 | Dart | ..................... | A47B 45/00 |
| | | | | 211/186 |
| 2015/0189787 A1* | 7/2015 | Bailey | ................ | H05K 7/1489 |
| | | | | 361/679.48 |
| 2015/0305202 A1* | 10/2015 | Veino | ............... | H05K 7/20745 |
| | | | | 361/679.46 |
| 2016/0057883 A1* | 2/2016 | Zebian | ............... | G11B 33/128 |
| | | | | 702/186 |
| 2016/0073546 A1* | 3/2016 | Chen | .................. | H05K 7/1489 |
| | | | | 361/679.33 |
| 2016/0128226 A1* | 5/2016 | Stellick | ............ | H05K 7/20727 |
| | | | | 361/679.46 |
| 2016/0356525 A1* | 12/2016 | Mavrommatis | ......... | F24F 1/027 |
| 2017/0082815 A1* | 3/2017 | Takeuchi | ............ | G02B 6/4452 |
| 2018/0035571 A1* | 2/2018 | Grinberg | ............ | H05K 7/20836 |
| 2018/0242477 A1* | 8/2018 | Gupta | ................. | H05K 7/20736 |

\* cited by examiner

DEVICES, SYSTEMS, AND METHODS FOR THERMAL MANAGEMENT OF RACK-MOUNTED COMPUTING INFRASTRUCTURE DEVICES

TECHNICAL FIELD

The subject matter described herein relates generally to computing infrastructure devices configured to be mounted within an electronics cabinet (e.g., a server rack). More particularly, the subject matter relates to devices, systems, and methods for providing thermal management for such rack-mounted computing infrastructure devices.

BACKGROUND

Today's rack-mounted computing equipment (e.g., servers, switches, power distribution units, etc.) have widely variable cooling requirements that are very often directly at odds with each other. In fact, because of their distinct roles, these different types of devices often must be installed in different orientations and/or locations within a computer infrastructure cabinet and, thus, different thermal management strategies and flow paths have been developed in order to cope with the limitations inherent in the installation positions of these devices. This is especially problematic for devices that need to be installed to face a rear side of a cabinet. One example of a category of such devices is networking switches and other similar peripheral devices, which will hereinafter collectively be referred to as "interface devices."

Datacenter cooling efficiency has rapidly become a key metric for datacenter operators to ensure that their environmental footprint is minimized and that their operating costs are kept as low as possible. While various studies have been performed to determine the optimal operating ambient supply temperature for cooling air in a datacenter, one key solution that has obtained widespread industry acceptance is the need to ensure that the conditioned air supply is fully segregated from a return flow path for exhaust air that needs to be conditioned again. This ensures that conditioned air cannot bypass the computing equipment that needs to be cooled and also that hot exhaust air cannot recirculate to mix with the conditioned air. This is often achieved by artificially sealing the "cold aisle" (e.g., the side of a cabinet where conditioned air is supplied) from the "hot aisle" (e.g., the side of cabinet from which hot air is exhausted), thus preventing, as far as is practicable, any large leakage paths from the cold aisle to the hot aisle. This cold/hot aisle segregation also helps in mitigating and/or preventing recirculation of heated air within a datacenter, which can occur when hot air exhausted from a cabinet recirculates and intermixes with the conditioned air supplied to the cold aisle without being re-conditioned again by the datacenter air conditioning units, thus raising the inlet temperature into a cabinet. Examples of such recirculation paths can include exhaust air flow passing over the top, around the sides, or under a cabinet, but can also include recirculation paths within the cabinet itself. One example of such a recirculation path within a cabinet is presented by the removal, whether for service or replacement, of one or more piece of computing equipment, creating a sizable void in the cabinet. Another example is the use of ducts that direct air flow towards equipment mounted at the rear of the cabinet, but which do not provide an effective seal, thereby creating a recirculation path that is localized to the equipment being served by the duct.

With the rapid growth of cloud computing and the proliferation of video streaming services, the IT industry is constantly in need of the best and fastest communications equipment (e.g., network switches, also referred to as "interface devices") available to maximize data transfer rates in constantly improving datacenters and computing network infrastructure environments. Most communications equipment in use today is connected to system manager configurations or otherwise is configured to provide for an increase in the number of communication ports for improved network communication capabilities. The vast majority of switches used in electronics cabinet applications are mounted to face the "hot aisle" side (e.g., the rear side) of the cabinet, but are located to still be inside the rear doors of the cabinet. The need to provide a substantially sealed flow path for this conditioned inlet air from the "cold aisle" side (e.g., the front side) of the cabinet to such rear-mounted interface devices has become a significant challenge, given the different types and physical dimensions of the interface devices used in today's converged platforms and solutions.

A common problem exists today, where each piece of communications equipment is designed for a very specific application (e.g., Infiniband™, Ethernet, Fibre Channel, etc.) and does not have a common form factor. Presently, this panoply of differently sized interface devices causes purveyors of customized pre-configured electronics cabinets of computing infrastructure devices to either design customized ducting solutions for each supported piece of communications equipment, thereby reducing the ability to support further customized solutions to particular client needs, or to implement a front-to-rear telescoping duct to provide a cooling path for most, but not all, of the variety of different depth communications equipment. Given such disparate and ever-changing cooling requirements, today there presently exists a need for an easily customizable solution capable of providing a substantially sealed flow path for conditioned inlet air from the "cold aisle" side of a cabinet directly to the inlet of such rear-mounted interface devices. The subject matter herein addresses these problems for all such interface devices that utilize a conventional front-to-back air flow path.

SUMMARY

In one aspect, a thermal management enclosure is disclosed. This thermal management enclosure is configured to be mounted inside an electronics cabinet to provide a flow path to one or more interface devices. This thermal management enclosure includes a first lateral portion and a second lateral portion configured to be joined to the first lateral portion at an expansion region. The first and second lateral portions are configured to be expanded laterally to define a width of the enclosure in an installed position.

In another aspect, a thermal management system is provided, which includes an electronics cabinet with front and rear mounting rails; at least one enclosure, which includes a first lateral portion and a second lateral portion configured to be joined to the first lateral portion at an expansion region; and one or more interface devices installed in the at least one enclosure to be accessible at the rear surface of the enclosure. The first and second lateral portions are configured to be expanded laterally to define a width of the enclosure, the enclosure is mounted to the front mounting rails at a front of the enclosure and to the rear mounting rails at a rear of the enclosure, and the at least one enclosure is configured to provide a flow path from an inlet side of the electronics cabinet at the front of the enclosure to an inlet of the one or more interface devices installed therein.

In still another aspect, a method is disclosed of providing conditioned air from a front of an electronics cabinet to one or more interface devices installed in an enclosure. The method includes inserting the enclosure into the electronics cabinet so the enclosure is disposed between front and rear mounting rails of the electronics cabinet, wherein the enclosure comprises first and second lateral portions movably attached to each other at an expansion region; attaching the enclosure to the mounting rails; inserting the one or more interface devices into a rear opening of the enclosure; and preventing recirculation of hot air through the rear opening of the enclosure.

BRIEF DESCRIPTION OF THE DRAWINGS

The subject matter described herein will now be explained with reference to the accompanying Figures (also "FIGS.") of drawings of which.

DETAILED DESCRIPTION

Figure 1:
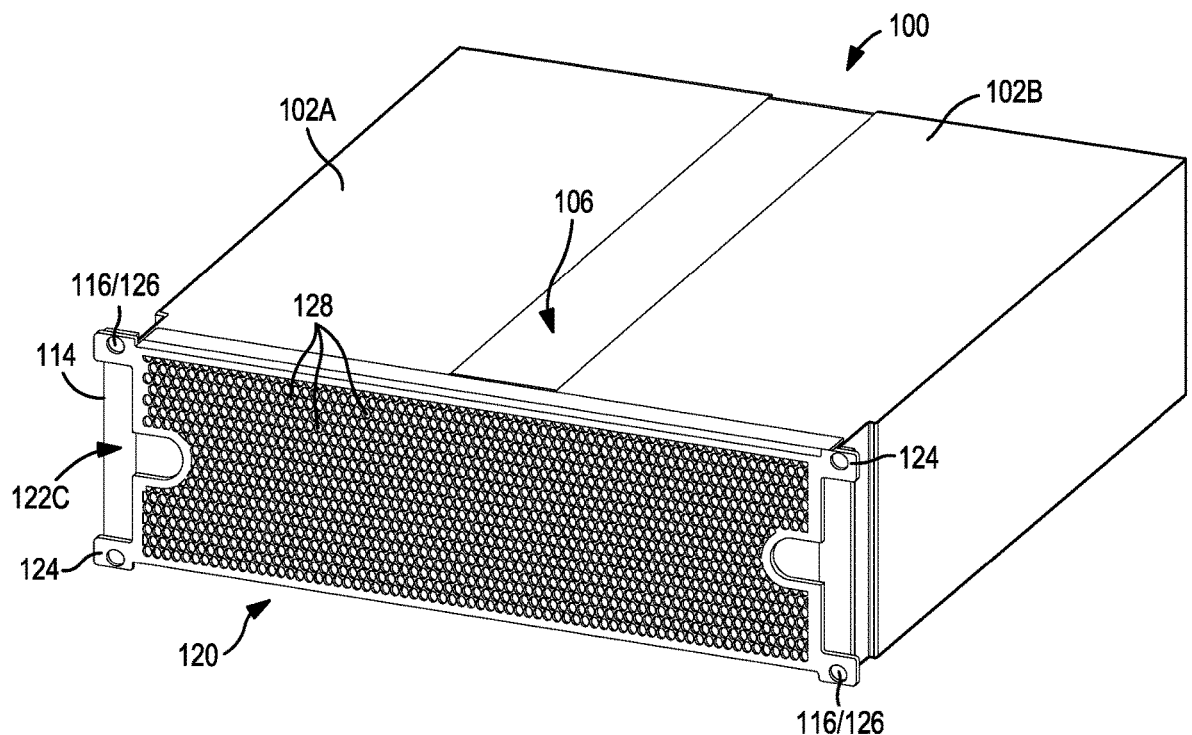
FIG. 1 is a perspective view of an example embodiment of an expandable thermal management enclosure in accordance with the disclosure herein.

The subject matter described herein discloses systems, devices, and methods for providing improved thermal management of rear-mounted computer infrastructure and communications equipment (e.g., a switch with a front-to-rear air flow path) in an electronics cabinet. The enclosure is configured to allow for installation of one or more piece of such equipment and to provide it with a dedicated and isolated cooling air flow path. The enclosure is configured to be sealingly mounted between mounting rails of a cabinet. The enclosure is configured for installation in a cabinet having a conventional depth between the mounting rails thereof, regardless of the space between the front and rear doors, if any, and the adjacent mounting rails. While a standard width between the cabinet mounting rails is 19 inches, the enclosure is compatible with cabinets having a wide range of widths between these mounting rails.

According to one embodiment, the enclosure has a height of 2 rack units (RU), which has a height of approximately 90 mm. In another embodiment, the enclosure has a height of 3 RU, having a height of approximately 135 mm. Other embodiments of other enclosure heights (e.g., 4 RU, 5 RU, etc.) are contemplated without deviating from the scope of the present invention, as will be readily understood by those having ordinary skill in the art.

It has become commonplace for other cabinet-mounted computing equipment (e.g., server computers) to be designed to extend well beyond the rear mounting rails of a cabinet. This creates a scenario where such server computers installed adjacent to an enclosure according to the present invention overhangs the enclosure, above and/or below the enclosure, thereby presenting a physical hindrance to installing, manipulating, or removing cable connectors from the interface devices installed in the enclosure. However, the installed position of the enclosure within the cabinet can be selected based on the other server computers installed in a cabinet; furthermore, not all hardware designed to be installed in a cabinet significantly extends beyond the plane defined by the rear mounting rails. With these considerations in mind, it is contemplated that, in some embodiments, the entire vertical interior height of the enclosure can be occupied by installed interface devices, leaving no space above or below the installed interface devices within the enclosure.

According to the 2 RU enclosure embodiment, a single 1 RU interface device is installed at a rear surface of the enclosure, preferably centered vertically within the 2 RU enclosure, such that 0.5 RU of empty space is present on top and bottom of the 1 RU interface device. In the 3 RU enclosure embodiment, two 1 RU interface devices or one 2 RU interface device can be installed at a rear surface of the enclosure, preferably centered vertically, as described above for the 2 RU enclosure embodiment. In some embodiments, therefore, brackets of approximately equal size of the 0.5 RU empty spaces are installed to prevent recirculation from the exhaust to the inlet of the interface devices. These brackets, in some embodiments, will have a compliant gasket material on one or both edges thereof to provide an improved seal to the adjacent surfaces of the interface devices and/or the enclosure. In some such embodiments, the brackets are mounted at a rear surface of the enclosure, protruding some distance within the enclosure (e.g., towards a front of the cabinet) to ensure that a surface of the installed interface devices, against which an adequate seal can be formed, is present. In other embodiments, this 0.5 RU bracket may be installed by mounting it at a front surface of the enclosure, the bracket extending towards the rear of the cabinet beyond a leading edge of the installed interface devices to form a seal against recirculation. This 0.5 RU space on top and bottom provides several benefits, including providing increased space for accessing and manipulating cable connector actuators (e.g, the locking tab of an Ethernet cable) which must be engaged and/or disengaged with the ports of the installed interface devices during insertion or removal of any such cables.

The enclosure is formed in some aspects from first and second lateral portions that, when assembled together, define the width of the enclosure. These first and second lateral portions can be configured as a first lateral portion and a second lateral portion and can be configured to be laterally expanded or retracted at an expansion region. In the area of the expansion region, either the first or second lateral portion is configured to be inserted, at least partially, within the other respective lateral portion, such that a sliding interface is formed therebetween. In some such embodiments, the first and second lateral portions are slidingly attached (e.g., by a pin inside of a mating slot) to each other to define a minimum width and a maximum width for the enclosure, thereby preventing an inadvertent separation of the two lateral portions during installation. The expansion region also allows for a manipulation of the enclosure during installation, whereby the front of the enclosure may be made a narrower width than the rear of the enclosure in order to, for example, allow for the insertion of locating pins into mounting rails of a cabinet at a rear of the enclosure before securing the front of the enclosure to the corresponding mounting rails of the cabinet. Once installed, the first and second lateral portions are secured with respect to each other by one or more fasteners to frictionally compress them together in the expansion region.

After installation of the enclosure in a suitable position in the cabinet, one or more interface devices can be installed within the enclosure. In some embodiments, the mounting kit hardware custom designed for use with the interface devices to be installed may be installed within the enclosure, thus customized mounting hardware need not be designed for each interface device to be installed in the enclosure. Depending on the design of each mounting hardware kit, it may be mounted to the front and/or rear mounting rails of the cabinet. In such embodiments, the cabinet supports the installed interface devices rather than the enclosure, thus allowing the enclosure to be made as light as possible since it need not actually support the installed interface devices.

In some embodiments, the enclosure can include a cable management system, which can extend from a rear of the enclosure and is configured to support and allow for organization of cables that are connected to the interface devices installed in the enclosure. In another embodiment, the enclosure can have a front panel configured to allow for cables, for example a power cord, to pass therethrough and be connected to the part of the installed interface devices facing the front of the cabinet and enclosure. The front panel can have one or more perforations and/or openings for air flow to pass through; these one or more perforations and/or openings can be in addition to or in lieu of any openings needed for the installation of cables and/or cords at the front of the enclosure.

FIGS. 1 through 9B illustrate various views, aspects, and/or features associated with an expandable thermal management enclosures.

Referring to FIG. 1, an example embodiment of a laterally expandable thermal management enclosure, generally designated 100, is shown. As shown in this view, enclosure 100 is formed as two parts, first lateral portion 102A and second lateral portion 102B. Enclosure 100 includes an expansion region 106, which is defined at a region where first and second lateral portions 102A and 102B laterally overlap each other. Enclosure 100 also has a front panel 120 attached at a front of enclosure 100 to cover a front opening thereof. Each of these structures will be described further hereinbelow.

Figure 2:
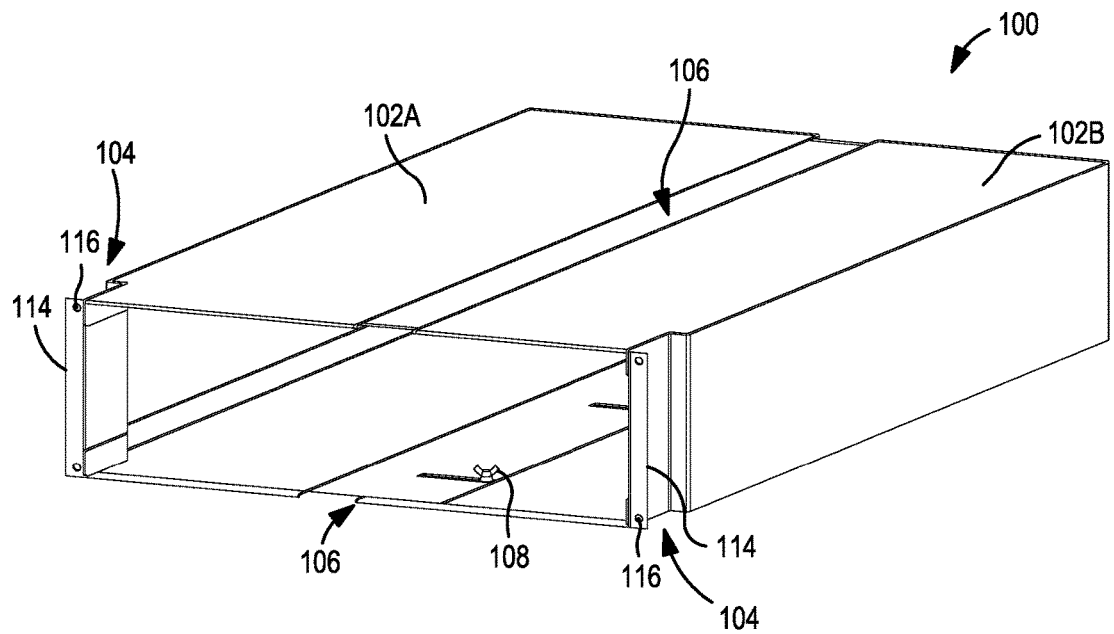
FIG. 2 is a perspective view of the example embodiment of the enclosure of FIG. 1, with the front panel removed, in accordance with the disclosure herein.

Referring to FIG. 2, enclosure 100, is shown without front panel 120 to better shown the arrangement of first lateral portion 102A and second lateral portion 102B, which are configured to laterally slide, at least partially, one over the other, at expansion region 106. In order to accomplish this, first lateral portion 102A has vertically stepped portions on the upper and lower lateral outer edges thereof in expansion region 106, such that a vertical distance between these stepped portions is less than a height of first lateral portion 102A. These stepped portions of first lateral portion 102A allow second lateral portion 102B to slide over the external surfaces of these stepped portions of first lateral portion 102A. As such, when first and second lateral portions 102A and 102B are moved towards each other such that enclosure 100 has a minimum width, top and bottom surfaces of enclosure 100 are substantially flat, with only a seam being externally visible at expansion region 106. However, when first and second lateral portions 102A and 102B moved away from each other, expansion region 106 is externally visible as a recessed area on both top and bottom surfaces of enclosure 100, as is shown at expansion region 106 in FIG. 2. The width of the externally visible portion of expansion region 106 corresponds to the distance that second lateral portion 102B is moved away from first lateral portion 102A. This recessed area has a depth corresponding approximately to a thickness of first and second lateral portions 102A and 102B.

Second lateral portion 102B has one or more posts (e.g., threaded rods) that are integrally formed in, or otherwise attached to (e.g., pressed into), the top and bottom surfaces thereof. Each of these one or more posts aligns with a corresponding slot formed in the stepped portions of first lateral portion 102A. In the example embodiment of FIG. 2, a total of six slots and posts are included, with three of each being disposed in each of the top and bottom surfaces of the first and second lateral portions 102A and 102B, respectively. The slots and posts are distributed along a direction from the front to the rear of enclosure 100. The slots are oriented to be substantially parallel to a direction of lateral expansion of enclosure 100 (e.g., the direction of the width of enclosure 100). The posts are formed so as to protrude into the interior of enclosure 100, so that adjacent space in an electronics cabinet will not be occupied by these posts.

A plurality of fasteners 108 (e.g., wingnuts) are threadably engaged (e.g., screwed) onto the posts of second lateral portion 102B, such that lateral movement of first and second lateral portions 102A and 102B relative to each other is prevented by them being pressed together and held in position via friction from a retaining normal force applied by tightening fastener 108 over a corresponding post. It will be understood that any suitable type of fastening arrangement may be substituted as fastener 108 without deviating from the scope of the present subject matter, as will be readily understood by those having ordinary skill in the art. In some embodiments, the width of enclosure 100, with first and second lateral portions 102A and 102B frictionally fixed in place by the tightening of fastener, at a position between the front edges and the rear edges is substantially a same or identical width as a distance between the mounting flanges. In some embodiments, the slots are open and intersect with the edge of first lateral portion 102A, such that the posts of second lateral portion 102B can slide out of the end of the slots at the edge of first lateral portion 102A. In other embodiments, the slots are closed and formed away from the edges of the first lateral portion 102A, so that the posts are captive within the slots when fastener 108 is threadably engaged with the posts, even when fasteners 108 are not fully tightened over the posts of the second lateral portion 102B. It will be apparent to one of ordinary skill in the art that the slots and posts can be of any suitable shape and can even be reversed, so that the slots are formed in the second lateral portion 102B and the posts are associated with the first lateral portion 102A; however, in embodiments where the slots and posts are reversed, the stepped portions may be formed in second lateral portion 102B rather than first lateral portion 102A.

Still referring to FIG. 2, both first and second lateral portions 102A and 102B have mounting flanges 114 on a front edge thereof, formed at a side of first and second lateral portions 102A and 102B away from expansion region 106. Each mounting flange 114 has two mounting holes 116 formed therein at a position corresponding to a mounting hole on the mounting rails of an electronics cabinet; these mounting holes 116 can be formed in any quantity by any suitable process and are configured to secure enclosure 100 to mounting rails 310 of an electronics cabinet 300 (see, e.g., FIGS. 6 through 9B). Both first and second lateral portions 102A and 102B have recesses 104 formed therein immediately behind respective mounting flanges 114 so that mounting hardware (e.g., mounting hardware 152 passing through mounting rails 310 and mounting holes 116) can be accommodated for securing mounting flanges 114 to mounting rails 310 without any interference between such mounting hardware 152 and any part of enclosure 100.

Figure 3:
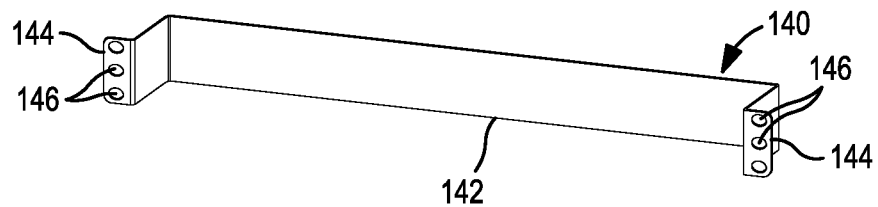
FIG. 3 is a perspective view of an example embodiment of a 1 RU filler panel for use in some configurations of the enclosure of FIG. 1, in accordance with the disclosure herein.

Referring now to FIG. 3, a filler panel, generally designated 140, is shown according to an example embodiment of the present invention. Filler panel 140 has a height substantially equal to 1 RU (e.g., 45 mm) and is configured to be installed in place of an interface device 200 (see, e.g., FIG. 6) whenever interface device 200 is removed for an extended period of time (e.g., greater than 1 minute). An allowable amount (e.g., a limit) of time for which interface device 200 may be removed before filler panel 140 must be installed can be selected by a manufacturer of enclosure 100 and/or a datacenter operator based on the cooling requirements of other computing equipment installed within the cabinet. Filler panel 140 comprises a bracket 142 formed in the general shape of a "C", with a mounting flange 144 being installed on each end of the "C" shape. Each mounting flange 144 includes one or more mounting holes 146 used to secure filler panel 140 in place with respect to enclosure 100, such that filler panel 140 protrudes into an interior of enclosure 100; this arrangement presents advantages, in that, for example, it provides an area for a vertical exhaust area out of an interface device 200 having such an exhaust flow path (see, e.g., FIG. 7E). Mounting flanges 144 are configured to be mounted on an external surface of the mounting rails 310, but other mounting arrangements and locations will be understood by those having ordinary skill in the art. In the embodiment of FIG. 3, bracket 142 is formed of a metal material (e.g., plate steel, aluminum, etc.), but bracket 142 can be formed or molded from any suitable material, including plastics, thermoplastic resins, and the like, especially in applications where weight is of particular concern (e.g., installation in an aircraft). In some embodiments, one or both of upper and lower edges of bracket 142 may have a gasket affixed thereto, providing an improved seal in some instances. Installation of filler panel 140 will be discussed further with respect to FIGS. 9A and 9B.

Figure 4:
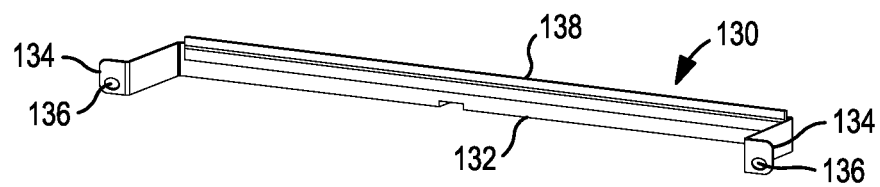
FIG. 4 is a perspective view of an example embodiment of a bypass filler panel for use in some configurations of the enclosure of FIG. 1, in accordance with the disclosure herein.

Referring to FIG. 4, a bypass panel, generally designated 130, is shown according to an example embodiment of the present invention. Bypass panel 130 has a height substantially equal to 0.5 RU (e.g., approximately 22.5 mm) and is configured to be installed in the 0.5 RU empty spaces within enclosure 100 above and below interface device 200 (see, e.g., FIG. 7E) to prevent recirculation of hot exhaust air through enclosure 100. As discussed briefly above, interface device 200 can, in some embodiments, be installed to be biased to a top or a bottom of enclosure 100, so that bypass bracket 130 will be a different height and, in some instances, filler panel 140 may be substituted as appropriate. Bypass panel 130 comprises a bracket 132 formed in the general shape of a "C", with a mounting flange 134 being installed on each end of the "C" shape. Each mounting flange 134 includes one or more mounting holes 136 used to secure bypass panel 130 in place within enclosure. Because bypass panel 130 is only 0.5 RU in height, only a single mounting hole 136 is provided, but an additional cut-out in mounting flanges 134 can be included so as to not block a mounting hole on the mounting rails 310 of cabinet 300, which are typically spaced at a pitch of 3 holes per 1 RU space in cabinet 300. In the embodiment of FIG. 3, bracket 132 is formed of a metal (e.g., plate steel, aluminum, etc.), but it is contemplated that bracket 132 can be formed or molded from any suitable material, including plastics, thermoplastic resins, and the like, especially in applications where weight is of particular concern (e.g., installation in an aircraft). A gasket 138 is adhesively attached, for example, on one side of bracket 132, providing an improved seal against an adjacent interface device 200. Installation of bypass panel 130 will be discussed further with respect to FIG. 7E.

Figure 5:
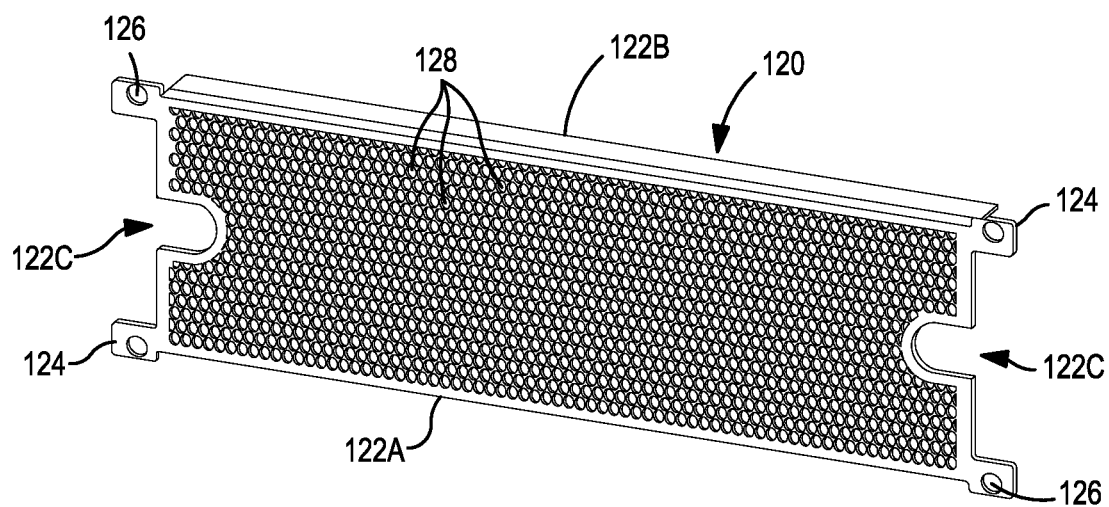
FIG. 5 is a perspective view of an example embodiment of the front panel for use in the enclosure of FIG. 1, in accordance with the disclosure herein.

Referring to FIG. 5, a front panel, generally designated 120, is shown according to an example embodiment of the present invention. Front panel 120 includes a face 122A, which is connected to tongue 122B. Tongue 122B is configured to protrude into enclosure 100 and to rest against or adjacent to the top surface thereof, serving to vertically located mounting holes 126 relative to mounting holes in mounting rails 310 of cabinet 300 for mounting of front panel 120 onto enclosure 100. Face 122A of front panel 120 is configured to occupy substantially all of a cross-sectional area of enclosure 100 and, as such, is substantially orthogonal to tongue 122B. One or more (here, two) cabling notches 122C are formed at lateral edges of face 122A and are configured to allow for cables (e.g., power cords) to pass through the plane defined by face 122A in an organized manner. Cabling notches 122C can be formed at any suitable location and in any suitable quantity and size. One or more perforations 128 are formed through a thickness of face 122A of front panel in order to allow an air flow to pass therethrough. Perforations 128 are circular in the embodiment shown, but may be any suitable shape (e.g., formed as one or more openings), such as, for example, triangular, square, pentagonal, hexagonal, and the like. The size and arrangement (e.g., the number, placement, and web thickness) of perforations 128 can be selected based on the air flow requirements and fan performance characteristics of the installed interface device 200, so as to not act as an excessively large impedance source. Mounting tabs 124 are disposed at the corners of face 122A, mounting tabs 124 having mounting holes 126 formed therein. In some embodiments, mounting holes may include a removable fastener (e.g., a push pin) for easy removal of front panel 120. While it is contemplated that front panel 120 may have a feature allowing for lateral expansion thereof, to allow a single front panel to be used for multiple installation widths between mounting rails 310 of cabinet 300, front panel 120 is shown in FIG. 5 as having a fixed width.

Figure 6:
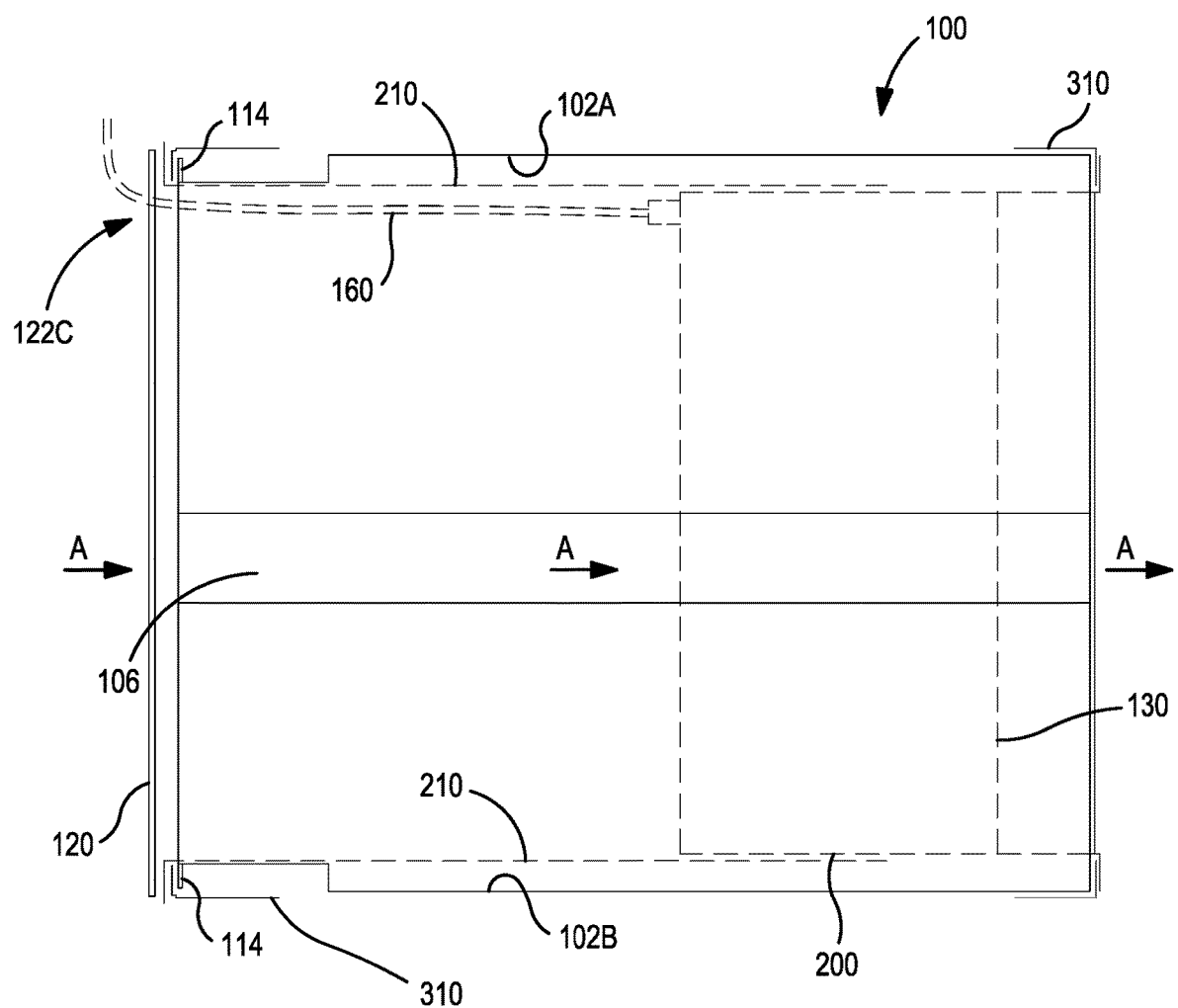
FIG. 6 is a rear view of an example embodiment of a faceplate used in a branding device.

Referring now to FIG. 6, a schematic top plan view for enclosure 100 installed in a cabinet 300 is shown according to an example embodiment of the present invention. First and second lateral portions 102A and 102B are shown being fixed at an installation width, so that expansion region 106 is visible in this top plan view. Enclosure 100 is installed to front mounting rails 310 of an electronics cabinet (see, e.g., cabinet 300 in FIG. 7A) at mounting flanges 114 and to rear mounting rails 310 at mounting features of enclosure 100. While other arrangements are contemplated, enclosure 100 is shown to be located between the internal surfaces of mounting rails 310; this arrangement allows for rails 210 to be mounted on an outside of these mounting rails 310, so that the electronics cabinet bears the weight of interface device 200, rather than enclosure 100. The dimensions of rails 210 will vary based on which particular interface device 200 is to be installed in enclosure 100, but in the embodiment shown in FIG. 6, rails 210 extend to and are secured in some fashion to a lateral side of interface device 200, but are not affixed to the rear mounting rails 310. As such, rails 210 and interface device 200 together span the entire distance of the depth between the front and rear mounting rails 310. Interface device 200 is mounted to an external surface of rear mounting rails 310, extending some distance into interface device 200 towards the front thereof. In FIG. 6, air flow A is illustrated with the corresponding arrow as flowing from the cold/inlet aisle (e.g., left side of FIG. 6) to the hot/exhaust aisle (e.g., right side of FIG. 6). Air flow A enters enclosure 100 through front panel 120, which is removably mounted at the inlet of enclosure 100. Power cords 160 are plugged into the rear of interface device 200 (e.g., the part of interface device 200 facing the front of the electronics cabinet) after passing through cabling notches 122C. Once inside enclosure 100, air flow A passes into the inlet of interface device 200 and is then exhausted from interface device 200 into the hot aisle. In order to prevent recirculation flow, bypass panels 130 are installed on the same mounting rails 310, on which interface device 200 are mounted. It can be seen that bypass panels 130 act as a blockage to air flow passing from the hot aisle over or under interface device 200 within enclosure 100.

FIGS. 7A through 7G show illustrations of various steps in a method of installing an example embodiment of enclosure 100 within a cabinet 300, according to an example embodiment of the present invention.

Figure 7B:
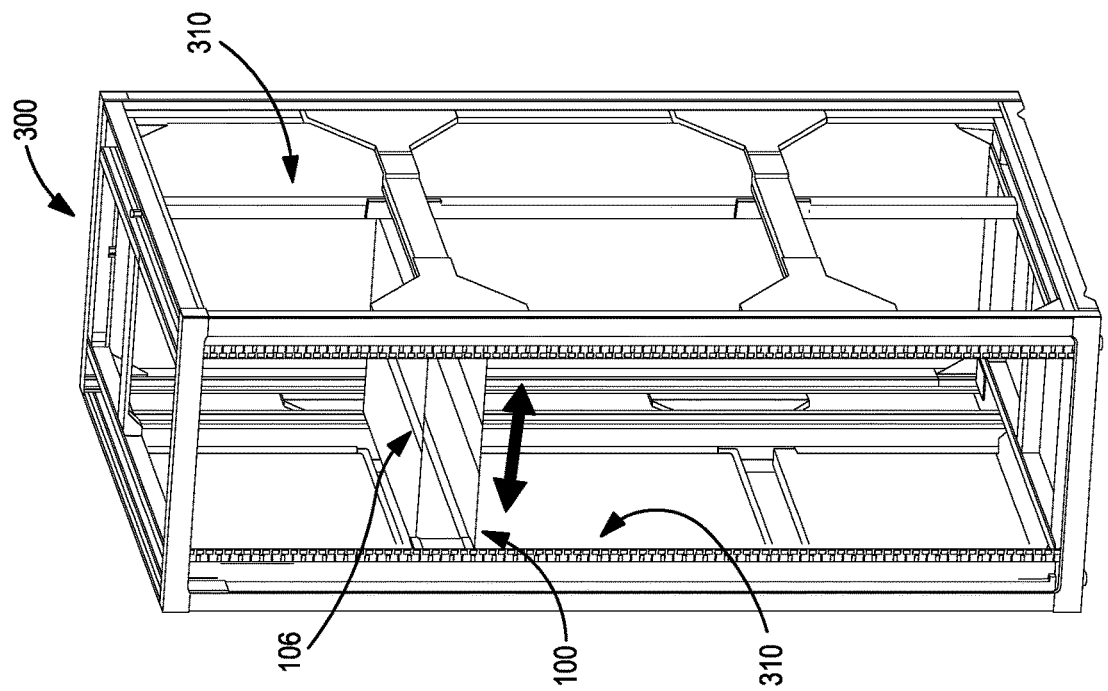
FIGS. 7A through 7G are perspective views illustrating example steps of installing the enclosure of FIG. 1 in a cabinet, in accordance with the disclosure herein.
Figure 7A:
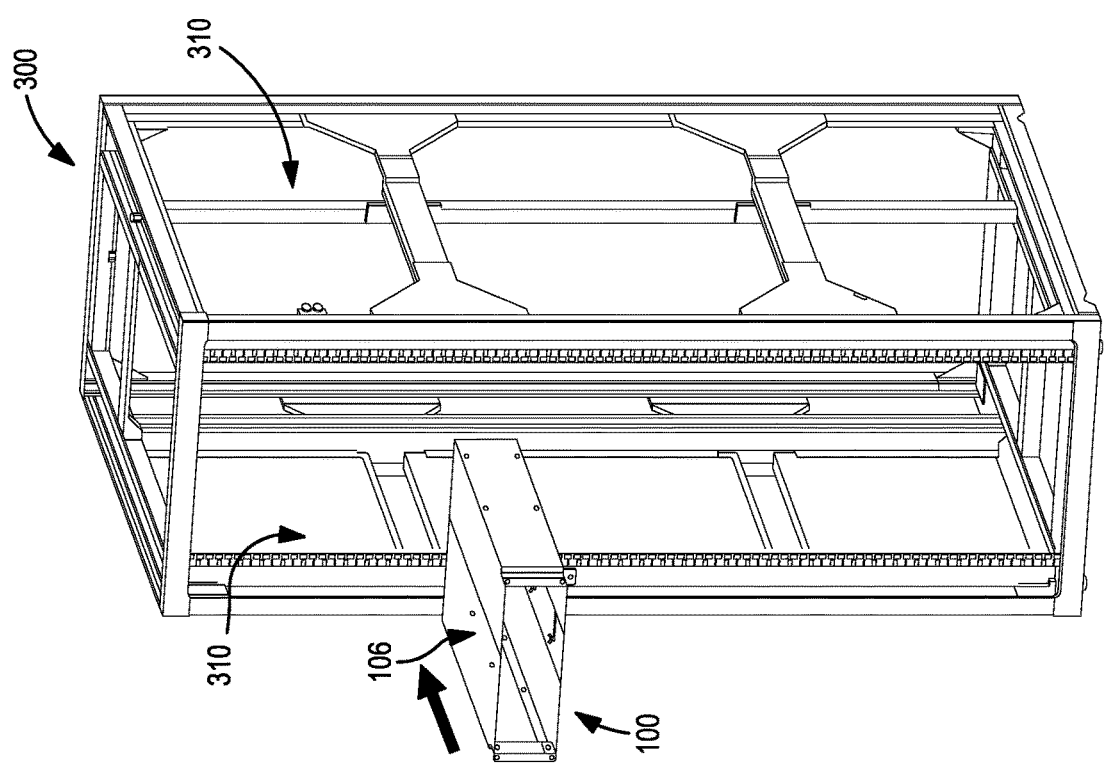

In FIG. 7A, enclosure 100 is in a fully laterally retracted position to be able to pass between mounting rails 310 of cabinet 300. In this fully retracted position, enclosure is inserted between mounting rails 310, as indicated by the arrow in FIG. 7A.

In FIG. 7B, enclosure 100 is expanded laterally to be mounted to mounting rails 310, as indicated by the horizontal double-headed arrow, revealing expansion region 106. As shown herein, enclosure 100 is expanded to have a width substantially the same as and identical to the width of mounting rails 310. While other types of fastening may be implemented, the rear surface of enclosure 100 has threaded pins that correspond to and are inserted through holes in mounting rails 310 in order to support the rear of enclosure 100 while the front of enclosure 100 is mounted to the front mounting rails 310 in a subsequent step.

Figure 7C:
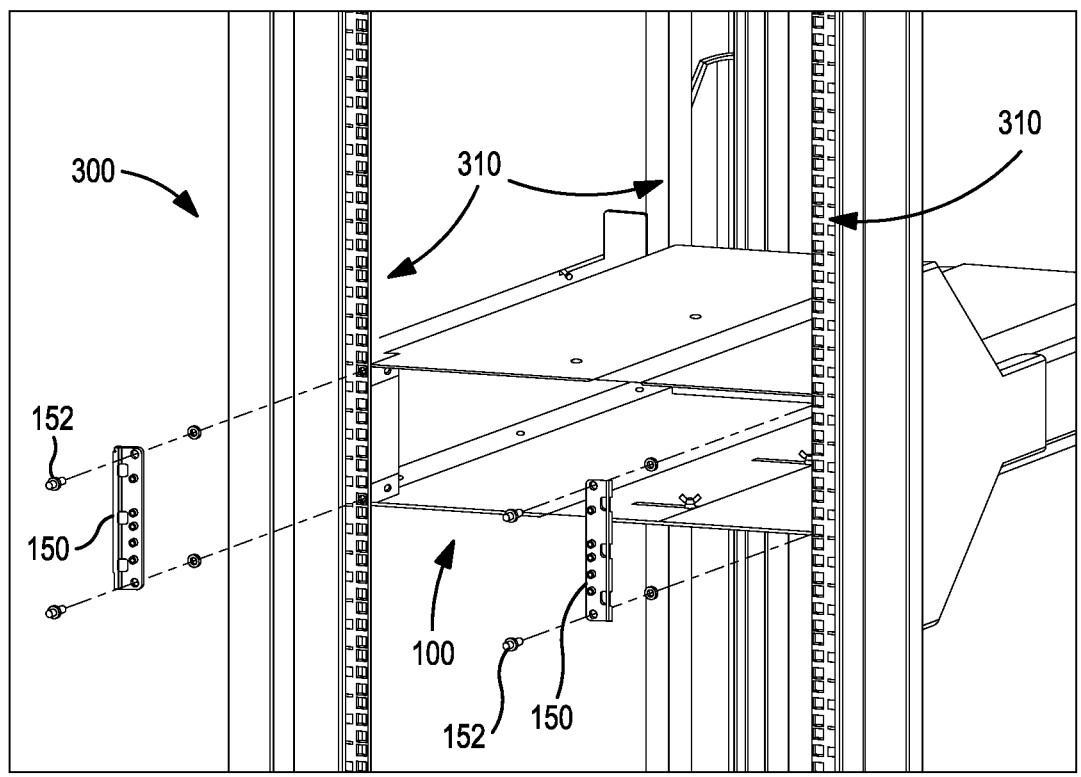

In FIG. 7C, mounting brackets 150 are shown being installed via mounting hardware 152 (e.g., by washers, threaded screws, etc.) on a front external surface of mounting rails 310. In some embodiments, a substantially similar mounting bracket may be installed at the rear of enclosure 100 to secure the rear portion of enclosure 100 within cabinet 300. Mounting hardware 152 may be configured to be threaded into, for example, captive nuts on a rear face of mounting flanges 114 or mounting holes 116 (see, e.g., FIG. 2) may themselves be threaded. After mounting brackets 150 are installed, enclosure 100 is securely attached to cabinet 300.

Figure 7D:
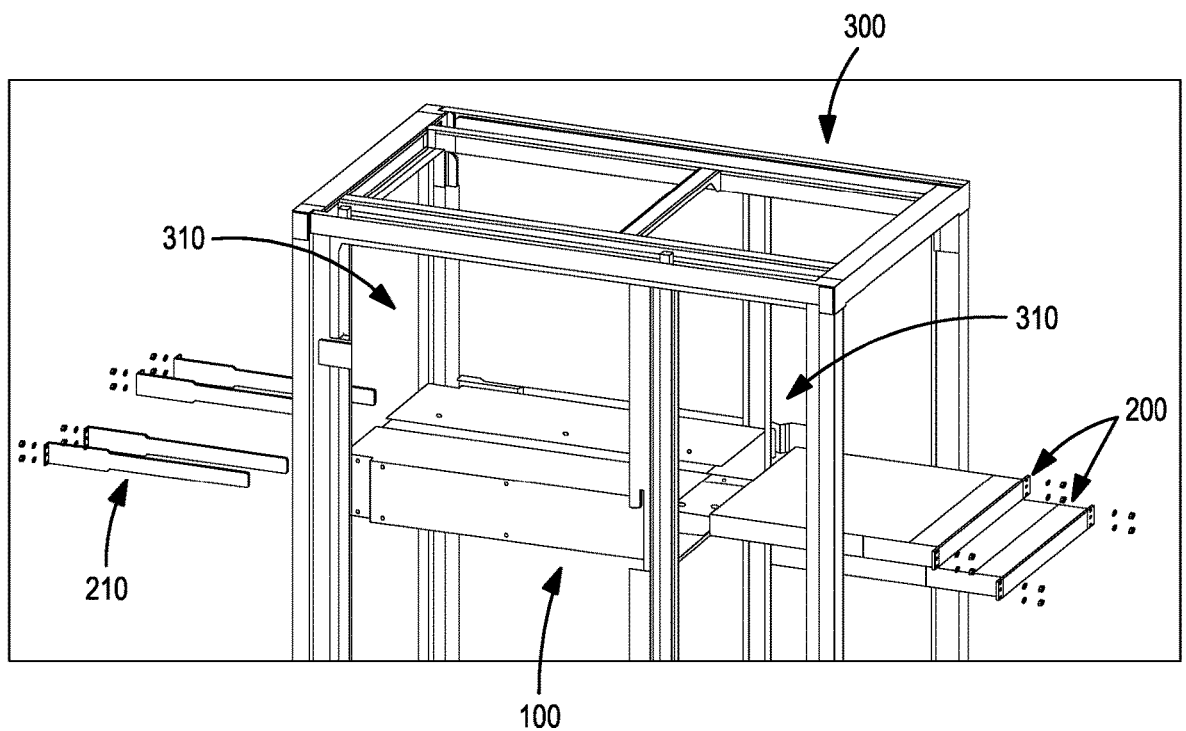

In FIG. 7D, with enclosure 100 secured within cabinet 300, rails 210 are installed within enclosure 100 from a front side thereof, with interface device 200 being installed within enclosure from a rear side of enclosure 100. Both interface device 200 and rails 210 are secured to mounting rails 310, rather than to enclosure 100 itself.

Figure 7E:
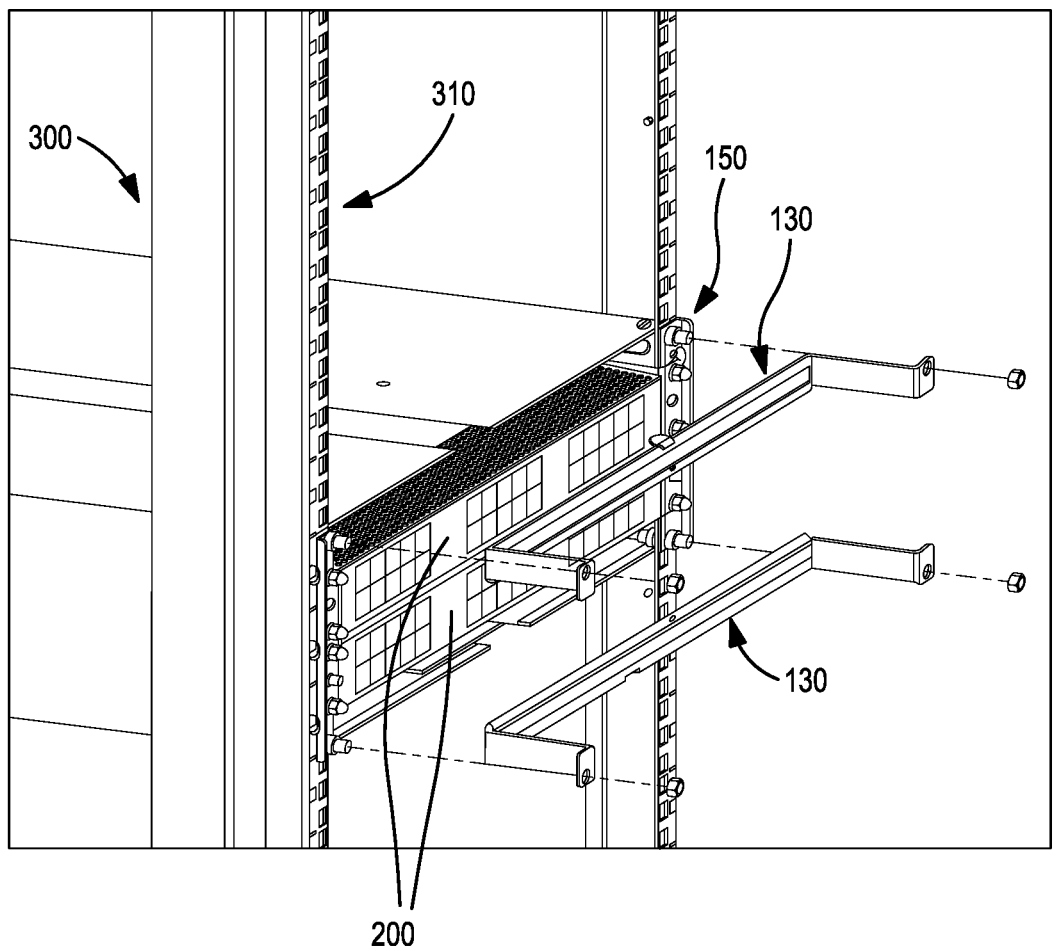

In FIG. 7E, rear mounting brackets 150 are visible, securing enclosure 100 to rear mounting rails 310. Additionally, bypass panels 130 are installed into the 0.5 RU spaces above and below the two pieces of interface device 200. Because the internal profile of enclosure, against which bypass panels 130 will be sealed, are largely identical between various installations, a gasket 138 (see, e.g., FIG. 4) is only installed on one edge of bracket 132 (see, e.g., FIG. 4) as the sealing surface of installed interface devices 200 may have unexpected variances that need to be compensated for, at least to some degree. As such, a bypass panel 130 is installed in the bottom 0.5 RU space in an orientation with gasket 138 against a bottom side of interface device 200, to which it is adjacent. An upper bypass panel 130 is installed in the top 0.5 RU space is rotated by 180 degrees relative to lower bypass panel 130, such that gasket 138 of upper bypass panel 130 is adjacent to and seals against an upper surface of interface device 200 installed in an upper position of enclosure 100. It can further be seen that this orientation is necessary for the mounting holes 136 (see, e.g., FIG. 4) of bypass panel 130 to align with the mounting holes of mounting brackets 150 and/or mounting rails 310.

Figure 7F:
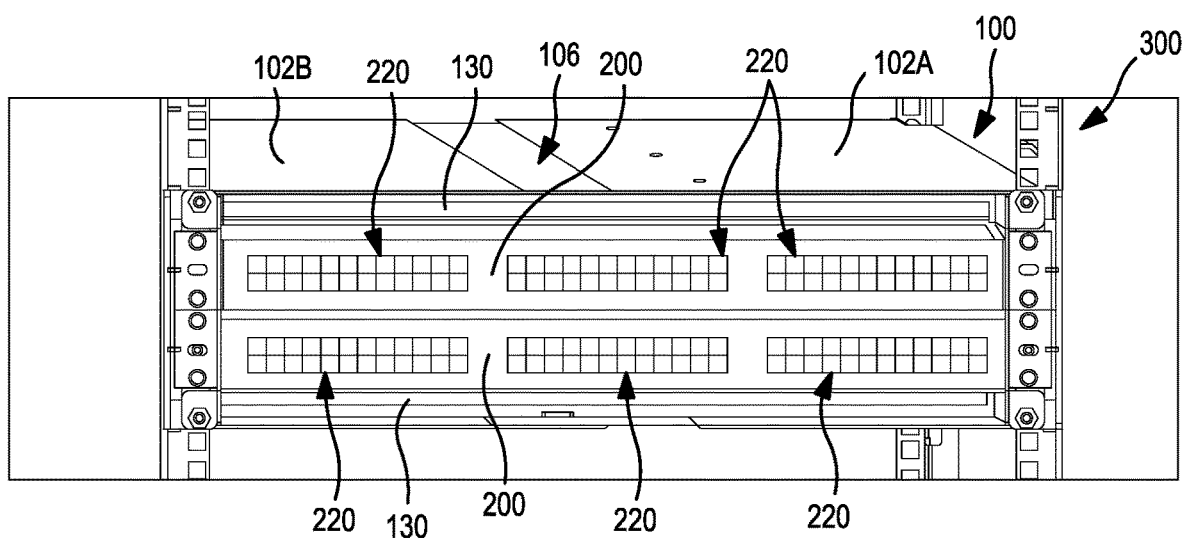

FIG. 7F shows a rear perspective view of enclosure 100 in an assembled state, with bypass panels 130 and interface device 200 installed therein. It can be seen that the bottom 0.5 RU of enclosure is occupied by bypass panel 130. Above the bottom 0.5 RU empty space, interface device 200 is installed in a first slot of enclosure 100. Interface device 200 is installed in the second slot of enclosure 100, which is defined as being directly adjacent to the first slot. A second bypass panel 130 is disposed in the top 0.5 RU space above the second slot of enclosure 100. In this example embodiment, interface device 200 is an Ethernet switch, having a plurality of connection ports 220 on a rear surface of interface device 200 so as to be accessible at a rear of cabinet 300. It can be seen that bypass panels 130, in conjunction with interface device 200, are configured to block substantially all recirculation paths, effectively presenting a substantially continuous surface at the rear of enclosure 100 to prevent hot air recirculation within enclosure 100 to the inlet of interface device 200.

Figure 7G:
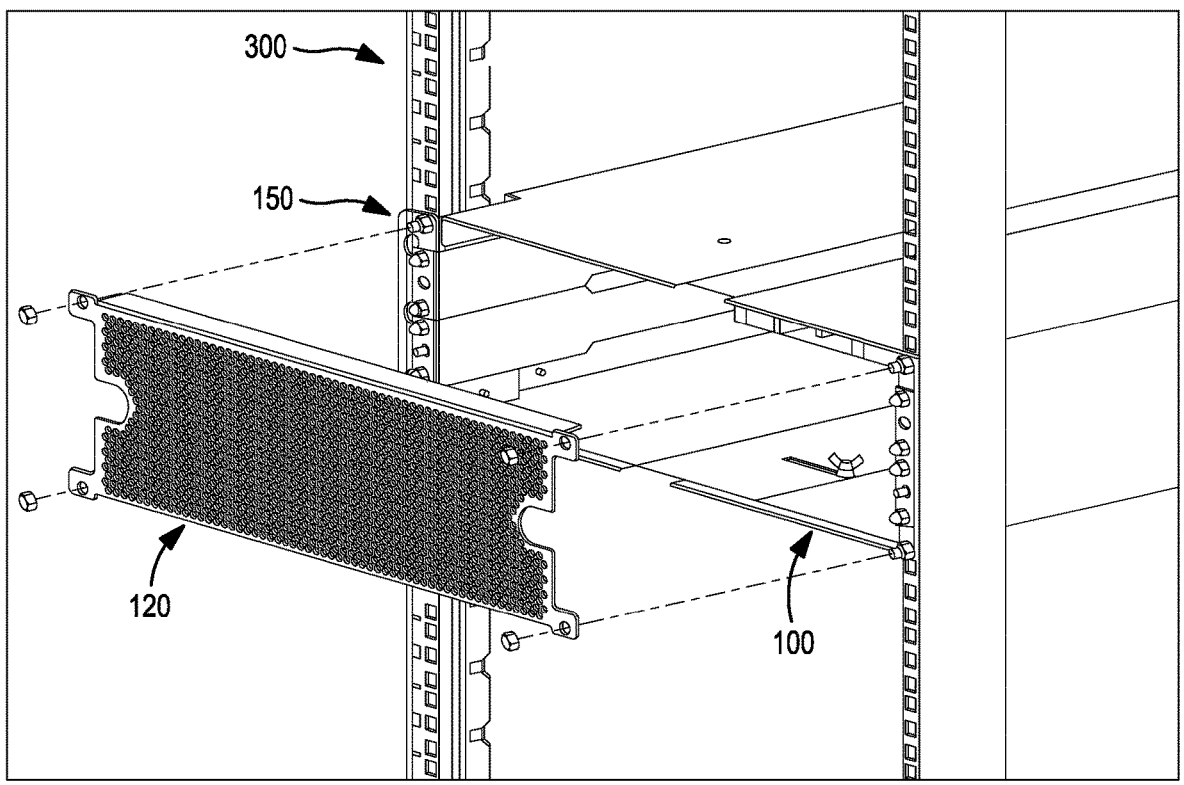

In FIG. 7G, a final step of installing enclosure 100 in cabinet 300 is shown, with front panel 120 being affixed to the front surface of enclosure 100. Front panel 120 is shown being affixed by fasteners (e.g., threaded nuts) onto threaded rods of mounting brackets 150, but any other suitable type of fastener is contemplated.

Figure 8:
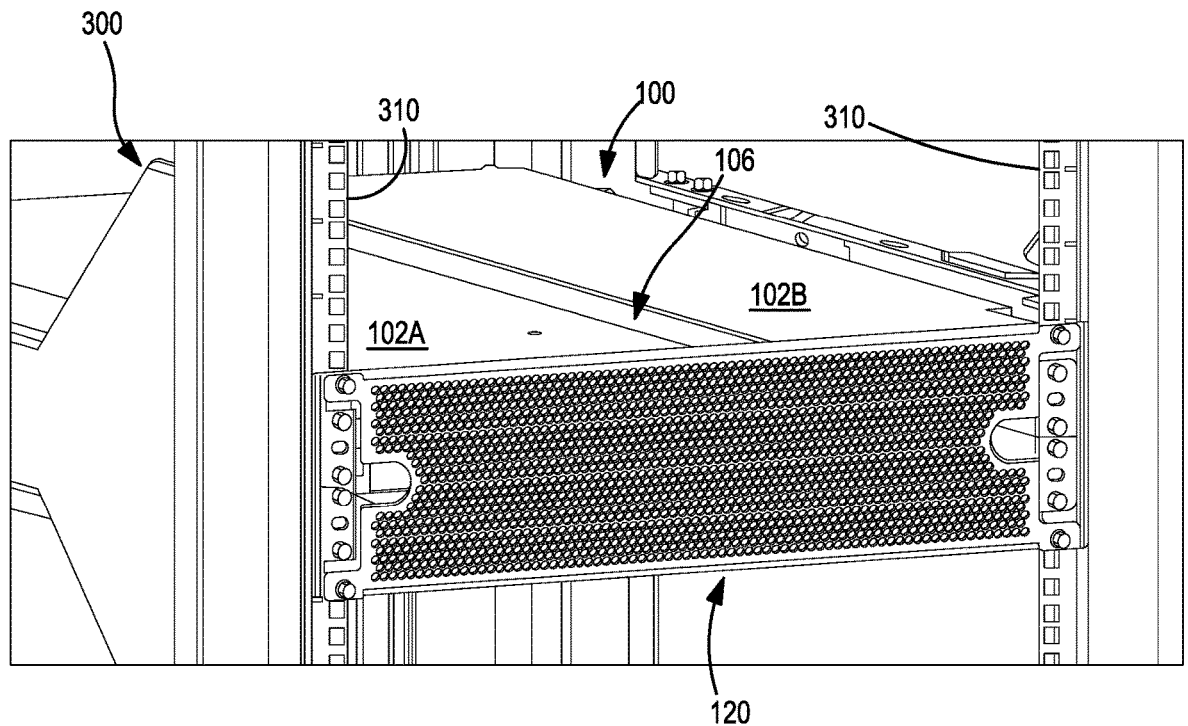
FIG. 8 is a perspective view illustrating the enclosure of FIG. 1 installed in a cabinet, in accordance with the disclosure herein

Referring now to FIG. 8, a front perspective view of an example embodiment of enclosure 100 is shown in an installed position, mounted to mounting rails 310 within cabinet 300, with a front panel 120 installed on a front surface of enclosure 100, with first and second lateral portions 102A and 102B being connected to each other in expansion region 106.

Figure 9A:
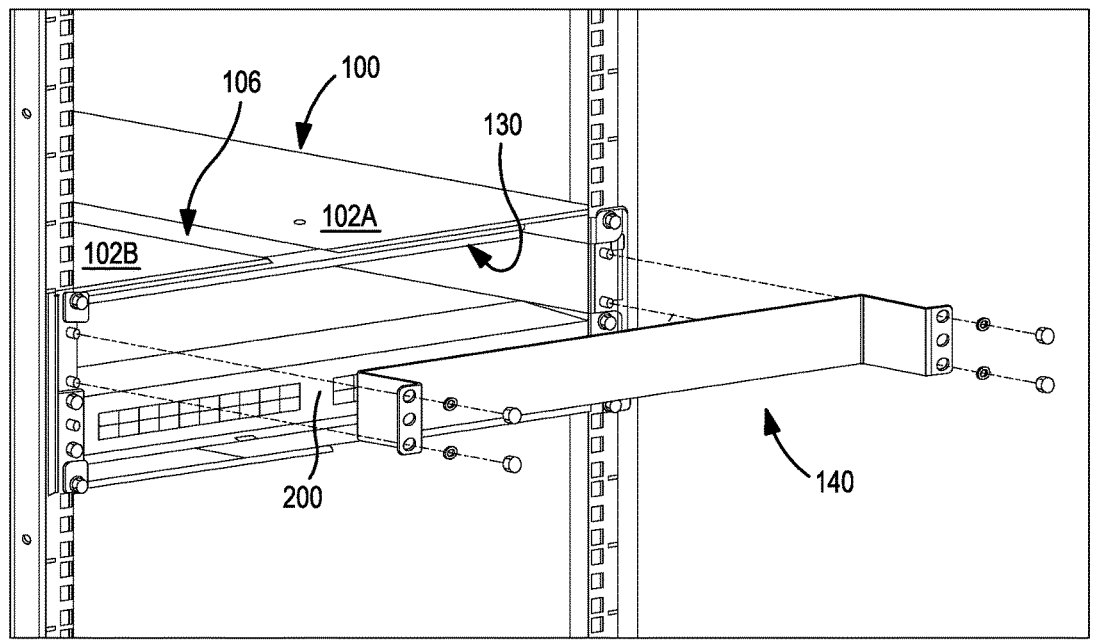
FIGS. 9A and 9B are perspective views illustrating installation positions of the 1 RU filler panel of FIG. 3 installed in the enclosure of FIG. 1, installed in a cabinet, in accordance with the disclosure herein.
Figure 9B:
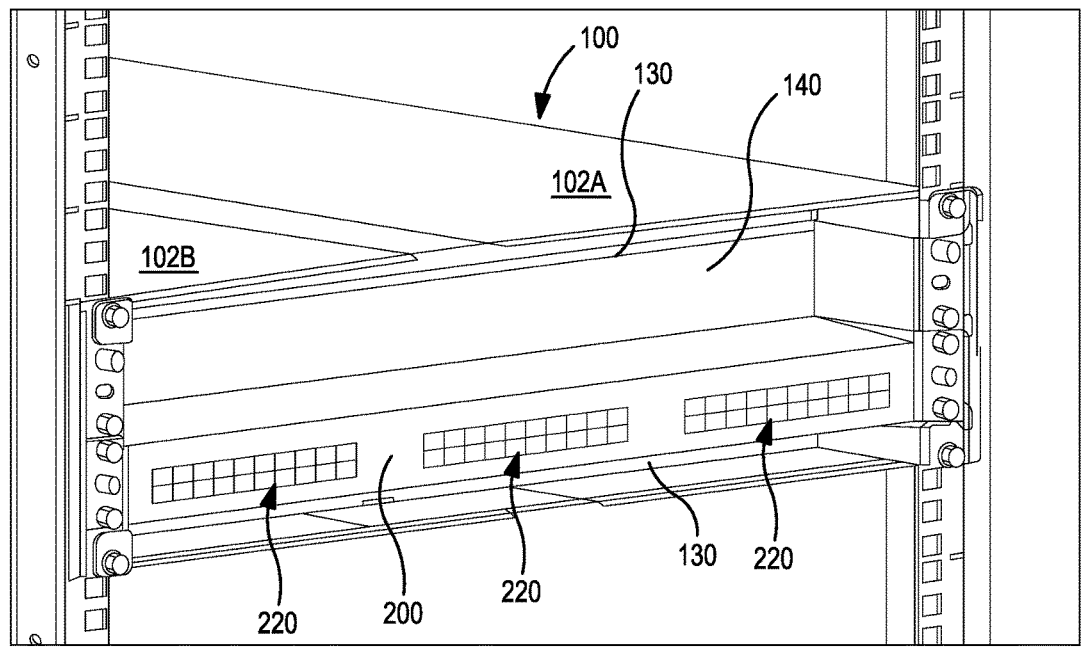

Referring to FIGS. 9A and 9B, an example embodiment of filler panel 140 being installed within enclosure 100 is illustrated. In FIG. 9A, a second (e.g., top) slot in enclosure 100 is empty, without any interface devices 200 being installed therein. It can be seen that upper and lower bypass panels 130 remain installed, with interface device 200 being installed in the first (e.g., bottom) slot in enclosure 100 as well. It can be seen also that filler panel 140 is substantially the same height (e.g., 1 RU) as the vacant second slot in enclosure 100. In FIG. 9B, filler panel 140 is shown installed in the second slot. As can be seen, the cross-sectional shape of filler panel 140 and bypass panel 130 are substantially identical, thus providing a substantially continuous impediment and blockage to air flow recirculating through enclosure 100 when one or more interface device 200 is not installed or has been removed.

Additionally, a method of installing a thermal management enclosure for interface devices is provided herein. In a first step, the enclosure (see, e.g., enclosure 100 in FIGS. 1-6) is retracted laterally, via the expansion region, and inserted into a cabinet. Next, the enclosure is laterally expanded, via the expansion region, so that a width of the enclosure is substantially identical to the width of the mounting rails of the cabinet. Next, the enclosure is affixed at its front and rear surfaces to mounting rails of the cabinet. In one embodiment, the front and rear of the enclosure are secured to mounting rails of the cabinet by mounting brackets and mounting hardware. In another embodiment, the front and/or rear of the enclosure are secured to the mounting rails by threaded pins being inserted into corresponding holes of the mounting rails of the cabinet. Either before or after affixing the enclosure to the mounting rails, a fastener is secured to fix a width of the enclosure. Next, rails and interface devices are installed in the enclosure. In one embodiment, rails and interface device are affixed to an external surface of the mounting rails of the cabinet, so that the cabinet bears the mass of the interface device rather than the enclosure. Next, bypass panels are inserted into the empty spaces above and below the interface device installed in the enclosure. Next, the front panel is installed on a front surface of enclosure. In another embodiment, a filler panel is installed when interface device is not installed in one or more slot of the enclosure.

It will be obvious to persons of ordinary skill in the art that the description of the subject matter provided above is not intended to be limited to only switches or even communication devices, but includes any interface device configured for mounting within an electronics cabinet where providing an isolated front-to-back air flow without substantial amounts of recirculation would be advantageous.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, including all such variations, modifications and alternative embodiments, within its scope and including equivalents of the claims. It is understood that various details of the presently disclosed subject matter may be changed without departing from the scope of the presently disclosed subject matter. Furthermore, the foregoing description is for the purpose of illustration only, and not for the purpose of limitation.

The invention claimed is:

1. An enclosure for thermal management configured to be mounted inside an electronics cabinet to provide a flow path to one or more interface devices, the enclosure comprising:
a first lateral portion; and
a second lateral portion configured to be joined to the first lateral portion at an expansion region;
wherein the first and second lateral portions are configured to be expanded laterally to define a width of the enclosure in an installed position; and
wherein the flow path provided by the enclosure to the one or more interface devices has an inlet formed in a front of the enclosure and an outlet formed in a rear of the enclosure, the inlet being on an opposite side of the enclosure from the outlet.

2. The enclosure of claim 1, wherein:
the first lateral portion has one or more slots oriented substantially parallel to a direction of lateral expansion of the enclosure,
the second lateral portion has at least one post configured to be disposed within a corresponding slot of the one or more slots, and
the first lateral portion is configured to move relative to the second lateral portion along a path defined by the one or more slots.

3. The enclosure of claim 2, wherein the at least one post is configured to be threadably engaged by a fastener to press together portions of the first lateral portion against the second lateral portion at the one or more slots to prevent lateral movement thereof when the fastener is fully threadably engaged with the at least one post.

4. The enclosure of claim 1, comprising:
mounting flanges on a front edge of each of the first and second lateral portions; and
a recess located behind the mounting flanges on the first and second lateral portions, the recess being configured to accommodate mounting hardware protruding through the mounting flanges on the front edge of the first and second lateral portions,
wherein the width of the enclosure at a position between the front edge and a rear edge is substantially identical to a distance between outer edges of the mounting flanges.

5. The enclosure of claim 1, comprising a front panel having a plurality of perforations and/or openings and one or more cabling slots formed therein.

6. A system for thermal management comprising:
an electronics cabinet with front and rear mounting rails;
at least one enclosure comprising:
a first lateral portion; and
a second lateral portion configured to be joined to the first lateral portion at an expansion region,
wherein the first and second lateral portions are configured to be expanded laterally to define a width of the enclosure; and
one or more interface devices installed in the at least one enclosure and accessible at a rear of the enclosure;
wherein the enclosure is mounted to the front mounting rails at a front of the enclosure and to the rear mounting rails at the rear of the enclosure, and
wherein the at least one enclosure is configured to provide a flow path from an inlet side of the electronics cabinet at the front of the enclosure to an inlet of the one or more interface devices installed therein.

7. The system of claim 6, comprising first and second bypass panels installed at the rear of the at least one enclosure,
wherein the first and second bypass panels are configured to prevent recirculation of hot exhaust air from a rear of the electronics cabinet, and
wherein the first bypass panel is installed in a bottom 0.5 RU (rack unit) space thereof and the second bypass panel is installed in a top 0.5 RU space thereof.

8. The system of claim 7, wherein the one or more interface devices are installed to be vertically between the first and second bypass panels, and wherein the first and second bypass panels are configured with one or more gaskets to sealingly engage an adjacent surface of the one or more interface devices.

9. The system of claim 6, comprising a front panel attached to the front of the enclosure, the front panel comprising a plurality of perforations or openings and one or more cabling slots formed therein.

10. The system of claim 6, wherein the front of the at least one enclosure is mounted to an internal surface of the front mounting rails and the rear of the at least one enclosure is mounted to an internal surface of the rear mounting rails, so the enclosure does not extend beyond the front or rear mounting rails of the electronics cabinet.

11. The system of claim 10, wherein the one or more interface devices are mounted to an external surface of the front and/or rear mounting rails of the electronics cabinet, wherein a majority of a mass of the one or more interface devices is supported by the mounting rails instead of the enclosure.

12. The system of claim 6, comprising, when one or more of the one or more interface devices is not present, a filler panel installed at the rear of the enclosure to prevent recirculation of hot exhaust air into and/or through the enclosure.

13. A method of providing conditioned air from a front of an electronics cabinet to one or more interface devices installed in an enclosure, the method comprising:
    inserting the enclosure into the electronics cabinet so the enclosure is disposed between front and rear mounting rails of the electronics cabinet, wherein the enclosure comprises first and second lateral portions movably attached to each other at an expansion region;
    attaching the enclosure to the mounting rails;
    inserting the one or more interface devices into a rear opening of the enclosure; and
    preventing recirculation of hot air through the rear opening of the enclosure.

14. The method of claim 13, comprising:
    installing a front panel on the enclosure to cover a front opening of the enclosure;
    providing one or more perforations and/or openings in the front panel for conditioned air to pass therethrough to an inlet of the one or more interface devices; and
    securing one or more cable through one or more cabling notches formed in the front panel.

15. The method of claim 13, comprising:
    expanding the enclosure laterally at the expansion region by moving the first and second lateral portions relative to each other in a direction of a width of the enclosure; and
    securing the first and second lateral portions at a width that is substantially identical to a distance between the front mounting rails or the rear mounting rails.

16. The method of claim 15, wherein expanding the enclosure laterally at the expansion region comprises at least one post of the second lateral portion moving along a path defined by one or more slot formed in the first lateral portion, and wherein securing the first and second lateral portions comprises threadably engaging a fastener over the at least one post to press portions of the first and second lateral portions together.

17. The method of claim 13, wherein attaching the enclosure to the mounting rails comprises:
    attaching a front of the enclosure to an internal surface of the front mounting rails of the electronics cabinet; and
    attaching a rear of the enclosure to an internal surface of the rear mounting rails of the electronics cabinet.

18. The method of claim 17, wherein the one or more interface devices are mounted to an external surface of the front and/or rear mounting rails of the electronics cabinet, and wherein a majority of a mass of the one or more interface devices is supported by the mounting rails instead of the enclosure.

19. The method of claim 13, wherein preventing recirculation of hot air comprises:
    installing a first bypass panel in a bottom 0.5 RU space at the rear of the enclosure; and
    installing a second bypass panel in a top 0.5 RU space at the rear of the enclosure;
    wherein the one or more interface devices are installed vertically between the first and second bypass panels, and
    wherein the first and second bypass panels are configured to sealingly engage with an adjacent surface of an adjacent interface device of the one or more interface devices.

20. The method of claim 13, comprising installing a filler panel when one or more of the one or more interface devices is uninstalled from the enclosure.

* * * * *